United States Patent
Guo

(10) Patent No.: US 6,813,005 B2
(45) Date of Patent: Nov. 2, 2004

(54) STORAGE CONTAINERS FOR LITHOGRAPHY MASK AND METHOD OF USE

(75) Inventor: Cheng Guo, New Providence, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/364,282

(22) Filed: Feb. 10, 2003

(65) Prior Publication Data

US 2003/0147063 A1 Aug. 7, 2003

Related U.S. Application Data

(63) Continuation of application No. 09/757,715, filed on Jan. 9, 2001, now abandoned.

(51) Int. Cl.[7] .................. G03B 27/62; B65D 85/00; B65D 85/48
(52) U.S. Cl. .................. 355/75; 206/710; 206/454
(58) Field of Search .................. 355/75, 53, 30, 355/73, 77; 250/492.2; 428/14; 206/710, 454; 414/217; 156/345.1

(56) References Cited

U.S. PATENT DOCUMENTS

| | | | |
|---|---|---|---|
| 4,131,363 A | 12/1978 | Shea et al. | 355/75 |
| 4,443,098 A | 4/1984 | Walwyn et al. | 355/74 |
| 4,511,038 A | 4/1985 | Miller et al. | 206/454 |
| 4,833,051 A | 5/1989 | Imamura | 430/5 |
| 5,286,567 A | 2/1994 | Kubota et al. | 428/422 |
| 5,422,704 A | 6/1995 | Sego | 355/53 |
| 5,453,816 A | 9/1995 | Wang | 355/75 |
| 5,729,325 A | 3/1998 | Kashida | 355/30 |
| 5,781,607 A | 7/1998 | Acosta et al. | 378/34 |
| 5,793,836 A | 8/1998 | Maldonado et al. | 378/35 |
| 5,897,979 A | 4/1999 | Tzu et al. | 430/5 |
| 6,038,015 A | 3/2000 | Kawata | 355/67 |
| 6,055,040 A | 4/2000 | Sego | 355/76 |
| 6,101,237 A | 8/2000 | Miyachi et al. | 378/35 |
| 6,103,427 A | 8/2000 | Storm | 430/5 |
| 6,132,553 A * | 10/2000 | Ikeda et al. | 156/345.1 |
| 6,216,873 B1 * | 4/2001 | Fosnight et al. | 206/710 |
| 6,222,609 B1 | 4/2001 | Nishimura | 355/30 |
| 6,315,512 B1 * | 11/2001 | Tabrizi et al. | 414/217 |

* cited by examiner

Primary Examiner—Peter B. Kim
(74) Attorney, Agent, or Firm—Shirley L. Church

(57) ABSTRACT

A container is provided for storing a lithographic printing mask. A first container section is formed of a sturdy material which defines a central inner recess area that is shaped to house a mask and to hold outer edges of a mask without touching a pattern on the mask. A second identical container section is placed against the first container section with a mask housed within recesses of, both to form a container which has a common pressure level all around and therein. A higher pressure level is then applied outside the container causes the first and second sections of the container to be held together. To remove the mask from the container, the pressure outside the container is reduced to substantially the pressure level inside the container and the first and second sections are pulled apart.

18 Claims, 2 Drawing Sheets

STORAGE CONTAINERS FOR LITHOGRAPHY MASK AND METHOD OF USE

This application is a continuation application of application Ser. No. 09/757,715, filed Jan. 9, 2001 ABN.

FIELD OF THE INVENTION

This invention relates to a container useful for holding (storing) mask, e.g., a Next Generation Lithography (NGL) mask, and preventing dust or other particles from reaching the mask, and to a method of using the container.

BACKGROUND OF THE INVENTION

Keeping a mask used in the fabrication of integrated circuits clean is critical. Dust or other particles on a mask can cause corresponding spots to be formed on the substrate of an integrated circuit being formed when the mask is illuminated. Such spots will produce an inaccurate reproduction of the mask on the substrate and thereby can reduce yield.

In prior art optical projection printing systems, light is generally projected from a light source through a lens arrangement and then a mask having a predetermined pattern formed thereon that is stored in a pellicle. The image projected from the mask is incident on a substrate having a light sensitive layer, e.g., photoresist, formed on a surface thereof. In this regard, see, for example, U.S. Pat. No. 4,131,363 (Shea et al.), issued on Dec. 26, 1978. The pellicle in such printing systems generally comprises a solid frame for holding a mask, and a transparent thin film that covers an upper opening of the frame. To print a mask pattern, the substrate and the mask within the pellicle are cleaned to remove any dust or particles thereon, and the bottom of the pellicle frame is securely mounted above the substrate around a light sensitive layer thereon to be irradiated. The pattern on the mask within the pellicle is then irradiated to transfer the pattern of the mask onto the light sensitive layer on the substrate. Generally, dust or other particles on the transparent thin film stretched over the pellicle frame is of no concern. This is because the film is positioned a sufficient distance above the mask so that dust or other particles on the film are out of focus when the surface of the substrate is irradiated through the mask with the type of radiation (e.g., Ultraviolet (UV), deep UV, or X-ray radiation) used in the prior art systems. Therefore, such dust or other particles on the surface of the pellicle itself do not affect the printed-pattern on the substrate.

Pellicles used in the prior art photolithography systems are generally secured to the substrate by various techniques such as using an adhesive, vacuum chucking techniques, magnets, and spring loading arrangements to protect the mask area from dust or other particles. In this regard see, for example, U.S. Pat. No. 4,833,051 (Imamura), issued on May 23, 1989. Prior art pellicles also have included various passageways through the sides of the pellicle frame for equalizing atmospheric pressure changes that occur between the protected area within the pellicle and outside of the pellicle while still protecting the protected area within the pellicle from dust or particles. Such passageway arrangements prevent the thin film covering the frame of the pellicle from deforming and contacting the surface of the mask when the pellicle is transported via different altitudes and/or environments. These passageways in the pellicle frame can include serpentine channels or a straight through passageway with filters mounted therein. In this regard see, for example, the Imamura patent cited above, and U.S. Pat. No. 6,055,040 (Sego), issued on Apr. 25, 2000.

For all Next Generation Lithography (NGL) systems where a narrow beam of radiation is used as, for example, electron beam printing technology, keeping a mask clean is critical. However, known pellicle materials are not transparent enough to radiation, e.g., electron beams and extreme ultraviolet radiation, used with NGL systems.

It is desirable to provide a container for holding a, mask that is to be used with NGL systems during transportation, storage, etc. to keep dust and/or particles from depositing on the mask. The design of the container should also reduce the chance of dust and/or particle being deposited on a mask during mask loading and unloading into and out of the container.

SUMMARY OF THE INVENTION

The present invention is directed to a container and use thereof for temporarily storing a Next Generation Lithography (NGL) mask in order to keep such a mask clean prior to it being used with, for example, electron beam printing technology.

A first apparatus aspect of the present invention is a container for housing a lithographic mask. The apparatus comprises a first section and a second section. The second section is in contact with the first section with the contacting first and second sections defining a cavity having a size-which is sufficient to house a lithographic mask and provide an air tight seal around the cavity when pressure within the cavity is less than pressure outside the container such that dust and other particles cannot reach a lithographic mask housed in the cavity.

A second apparatus aspect of the present invention is a container for storing a lithographic printing mask. The container comprises a first container section formed, of a sturdy material and a second container section formed of a sturdy material. When the first and second container sections are placed together they define a cavity therein having a size to fixedly house a mask while not contacting a mask pattern on the mask and provide an air tight seal around the cavity when pressure within the cavity is less than pressure outside the container such that dust and other particles cannot reach the mask housed in the cavity.

A third apparatus aspect of the present invention is a container for storing a lithographic printing mask. The container comprises first and second sections. The first container section is formed of a sturdy material and defines a first cavity which is shaped for contacting an edge section of a mask to be stored in the container and covers, but does not contact an area of a mask pattern on the mask when the edge section of the mask is placed in the cavity. The second container section is formed from a sturdy material and defines a second cavity therein having a size which contacts an edge section of a mask to be stored in the container wherein when the first and second container sections are placed together they fixedly house the mask in the first and second cavities and provide an air tight seal around the cavity when pressure within the first and second cavities is less than pressure outside the container such that dust and other particles cannot reach the mask housed in the cavity.

A fourth apparatus aspect of the present invention is a container for storing a lithographic printing mask. The container comprises first and second container sections. The first container section is formed of a sturdy material and defines a first cavity which is shaped for contacting an edge section of a mask to be stored in the container and covers, but does not contact an area of a mask pattern on the mask when the edge section of the mask is placed in the cavity. The second container section is formed from a sturdy material and defines a second cavity therein having a size which contacts an edge section of a mask to be stored in the container wherein when the first and second container sections are placed together they fixedly house the mask in the first and second cavities and provide an air tight seal around the cavity when pressure within the first and second cavities is less than pressure outside the container such that dust and other particles cannot reach the mask housed in the cavity.

A method aspect of the present invention is a method of storing a mask in a container comprising first and second sections which are both cleaned to remove particles thereon. The method comprising the steps of: placing first and second cleaned sections of the container and a cleaned mask in a chamber and reducing the pressure within the chamber to a first pressure level; while the mask is in the chamber which is at the first pressure level, placing the mask in a cavity defined by portions of the first container section such that a mask pattern on the mask does not contact any portion of the first container; while the mask is in the cavity, placing the second container section in contact with the first container section to form the container and to seal the cavity therein from dust and particles and any pressure changes outside the container; and raising the first pressure level surrounding the container to a second higher pressure level to seal and hold the first and second container sections together.

The invention will be better understood from the following more detailed description taken with the accompanying drawing and claims.

The drawings are not necessarily to scale.

DETAILED DESCRIPTION OF THE INVENTION

It is to be understood that corresponding elements having the same function in the several views of the drawings are provided with the same designation numbers.

Figure 1:
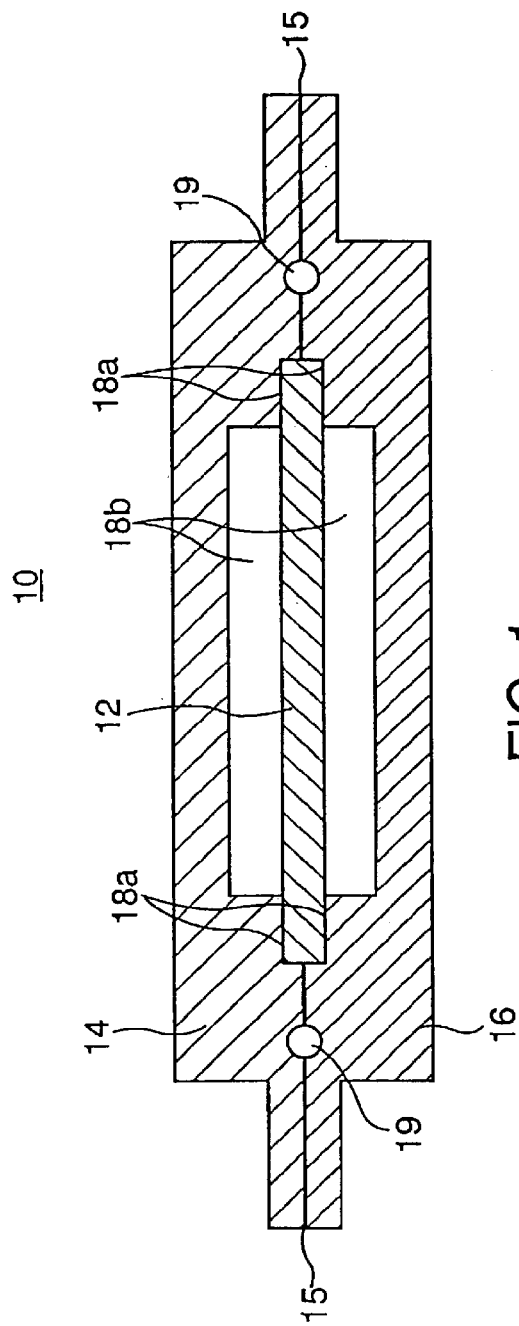
FIG. 1 shows a cross-sectional side view of a container with a Next Generation Lithography (NGL) mask stored (housed) therein in accordance with the present invention.

Referring now to the FIG. 1, there is shown a cross-sectional side view of a container 10 for storing (housing) a mask 12 in accordance with the present invention. The container 10 is particularly suited for housing (storing) a mask 12 of the type used in Next Generation Lithography (NGL) systems including electron beam lithography and may be used for housing conventional lithographic masks. The storage container 10 comprises an upper half 14 and a lower half 16. In a preferred embodiment the halves 14 and 16 are identical. The upper half 14 and the lower half 16 of the storage container 10 are formed of a sturdy material such as, for example, a metal, plastic, or other sturdy composition material (i.e., a material capable of esentially not deforming with a vacuum applied to portions thereof). Each of the upper and lower halves 14 and 16 defines first and second inner recess sections (cavities) 18a and 18b in a portion of the first and second halves 14 and 16 when the two halves 14 and 16 are placed together. The first inner recess section (cavity) 18a is formed around an outside edge of the overall inner recess area for contacting and holding edge portions of the mask 12 when it is stored therein. The second inner recess section (cavity) 18b, which is deeper than the first inner recess section 18a, is in a central area of the overall inner recess area so that it does not contact, and is over the area of the mask 12 where a mask pattern is actually found. A compressible O-Ring 19 is positioned around a surface 15 of one of the upper and lower halves 14 and 16 where the halves 14 and 16 where the upper and lower halves 14 and 16 come together to prevent air leakage into the first and second inner recess section 18a and 18b when the container 10 is subsequently vacuum sealed with a mask 12 stored therein. The compressible material can comprise any suitable material such as, rubber, which will seal the first and second inner recesses 18a and 18b. Optionally, small channels (not shown) can be formed in both the upper and lowers halves 14 and 16 of container 10. These channels are in communication with each other at least one location where the upper and lower halves 14 and 16 contact each other so as to help ensure that pressures in recesses 18b of both halves are equal.

Figure 2:
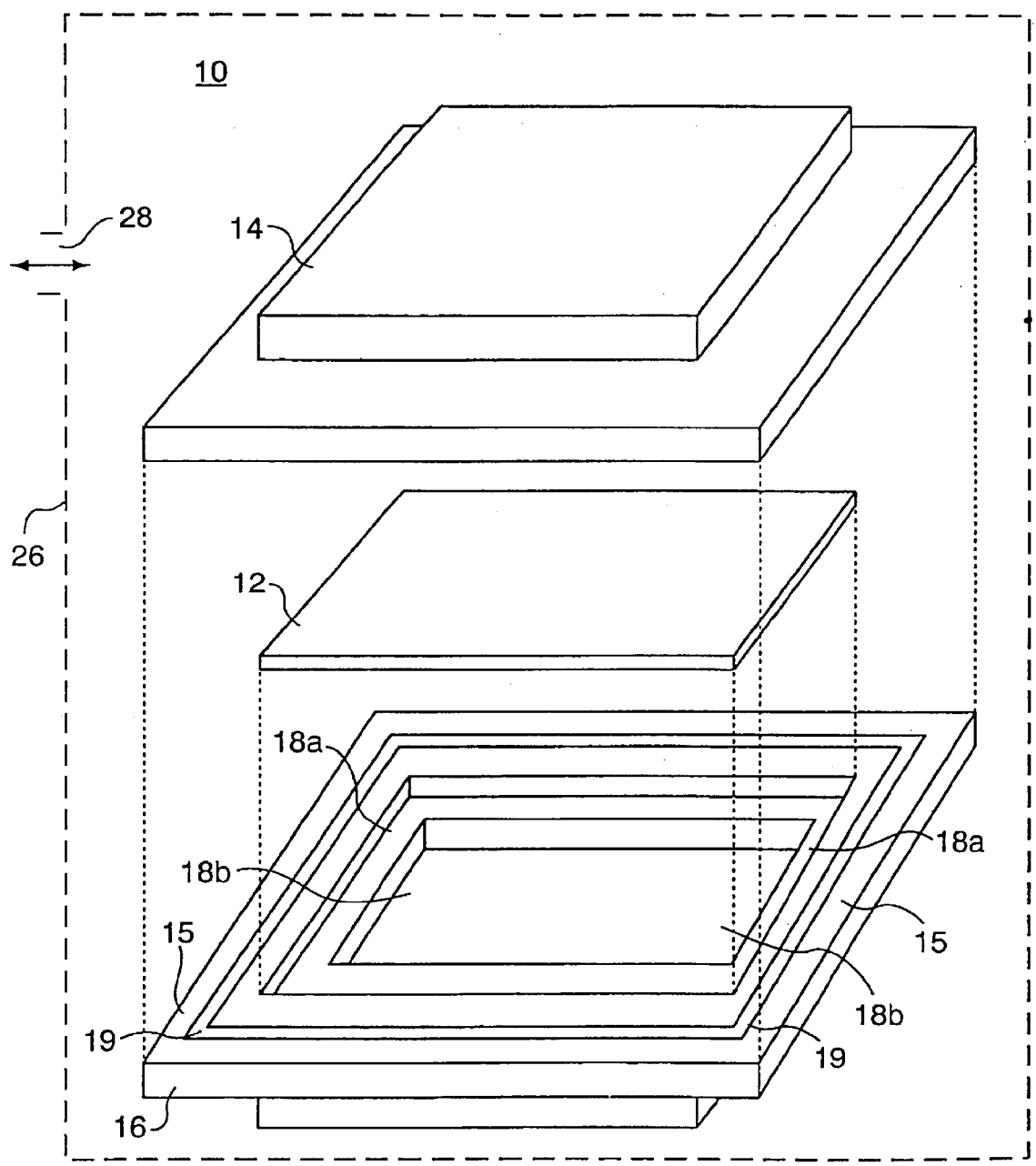
FIG. 2 shows a cross-sectional schematic view of a vacuum chamber with the container (shown in perspective view) of FIG. 1 housing a NGL mask in accordance with the present invention.

Referring now to FIG. 2, there is shown a perspective view of a vacuum chamber 26 with the container 10 of FIG. 1 therein. To mount a mask 12 in the container 10, the first and second halves are separated and placed within the vacuum chamber 26 (shown within a dashed line rectangle) which is dust and particle free. A selectively operated vacuum source (not shown) reduces the pressure in the chamber 26 to a predetermined vacuum level via a port 28. The surfaces of the mask 12 and especially the inner recess areas 18a and 18b are then cleaned to make sure that no dust or particles remain thereon. The mask 12 is then placed in the inner recess section 18a of the second half 16 of the container 10, and the first half of the container 10 is symmetrically placed onto the second half 16 and in contact with the O-ring 19. At his point in time, the predetermined pressure (vacuum) level in the chamber 26 is the same inside the first and second inner recess areas 18a and 18b and outside the container 10. The pressure in the chamber 26 is then increased to atmospheric pressure outside of the chamber 26. The pressure outside the container 10 is now greater than the pressure level inside the first and second inner recess sections 18a and 18b. This holds the first and second halves together. Additionally, the O-ring 19 is compressed by the holding force of the vacuum in the first and second inner recesses 18a and 18b to prevent air from leaking into the first and second inner recess sections 18a and 18b. The container 10 storing (housing) a mask 12 can then be then removed from the chamber 26 and shipped to where it will be used.

In use, a container 10 housing a mask 12 is placed in a clean chamber 26 where a lithographic machine (not shown) is located. The pressure in the chamber 26 is reduced to the predetermined vacuum level so that the container 10 can be opened, i.e., the sections 14 and 16 can be separated. Once the container 10 in opened in the clean chamber 26, the mask 12 is removed from the container 10 and transferred for use in the lithographic machine to print a plurality of circuit substrates (not shown). It is to be noted that the upper 14 and lower 16 halves are not connected together at all by a hinge or other type of coupling device. This means that there are no surfaces that rub against each other when the two halves 14 and 16 are separated. Accordingly, there are no particles formed from a coupling device that can fall onto the mask 12 stored in the container 10 of FIG. 1 or the container 10a of FIG. 2.

Figure 3:
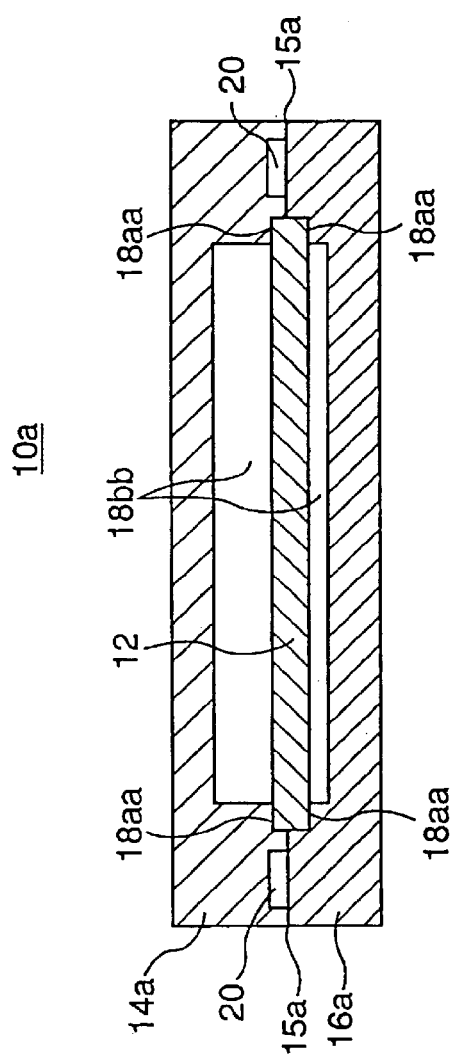
FIG. 3 shows a cross-sectional side view of an other container with NGL mask stored (housed) therein in accordance with the present invention.

Referring now to FIG. 3, there is shown a cross-sectional side view of a container 10a for storing (housing) a mask 12 in accordance with the present invention. The container 10a is similar to the container 10 of FIG. 1 but comprises a different outside configuration without extra protrusions, and has a somewhat different internal recess configuration. The storage container 10a comprises an upper half 14a and a lower half 16a which have a rectangular shape. Each of the upper and lower halves 14a and 16a defines first and second inner recess sections 18aa and 18bb in a portion thereof when the two halves 14a and 16a are placed together. The first inner recess section 18aa is formed around an outside edge of the overall inner recess area for contacting and holding edge portions of the mask 12 when the mask 12 is stored in the upper and lower halves 14a and 16a. This avoids movement of the mask 12 during any movement of the container 10a which can cause the possible release of particles from the rubbing of the mask 12 with the container 10a. The second inner recess section 18bb, which is deeper than the first inner recess section 18aa, is in a central portion of the overall inner recess area so that it does not contact and is over the area of the mask 12 where a mask pattern (not shown) is actually found.

A layer of a compressible material 20 is positioned around the circumference of the container 10a outside the first inner recess section 18aa where the upper and lower halves 14a and 16a come together to prevent air leakage into the first and second inner recess section 18aa and 18bb when the container is subsequently vacuum sealed with a mask 12 stored therein. The upper half 14a and the lower half 16a of the container 10a are formed of a sturdy material such as, for example, a metal, plastic, or other sturdy composite material and define first and second inner recess sections 18aa and 18bb when the two halves 14a and 16a are placed together. The recess section 18aa is formed around the recess section 18bb and is sized to hold edge portions of the mask 12 when it is stored therein. The inner recess section 18aa is sized such that it does not contact the area of the mask 12 where the mask pattern is actually found. The layer of a compressible material 20 is positioned around a surface 15a of at least one of the upper and lower halves 14a and 16a where the halves 14a and 16a come together to prevent air leakage into the first and second inner recess sections 18aa and 18bb when the container 10a is subsequently vacuum sealed with a mask 12 therein. The compressible material 20 can comprise any suitable material such as, rubber, which will seal the first and second inner recesses 18aa and 18bb.

The mask 12 can be inserted and removed from container 10a using the vacuum chamber 26 of FIG. 2 in essentially the same manner as container 10 of FIG. 1 has a mask 12 inserted and then removed therefrom.

It is to be appreciated and understood that the specific embodiment of the invention described hereinbefore are merely illustrative of the general principles of the invention. Various modifications may be made by those skilled in the art which are consistent with the principles set forth. More particularly, the first and second halves 14, 14a and 16, 16a can have any other shape as, for example, a rectangular outside shape with or without external protrusions from that shown in FIGS. 1–3.

What is claimed is:

1. A storage container for a lithography mask, which storage container is periodically used independently of a lithography system which is used in combination with said mask, said storage container comprising:

a first container section formed of a sturdy material which does not deform upon exposure to a vacuum adequate to provide air tight sealing of said storage container; and a second container section formed of said sturdy material, wherein said first and second container sections used in combination define a cavity sized to fixedly house said mask, while not contacting a mask pattern on said mask, and wherein said first and second container sections used in combination provide an air tight seal around said cavity when a pressure within said cavity is less than a pressure outside said storage container, whereby dust and other particles cannot reach said mask housed in said cavity, and wherein said first and second container sections are essentially solely held together to form said cavity by the pressure difference between the pressure within said cavity and the pressure outside said storage container.

2. The storage container of claim 1 further comprising a compressible material which is capable of forming said air tight seal around said cavity, which compressible material is located on a surface of at least one of said first and second container sections which come together in a manner which surrounds said cavity and provides said air tight seal.

3. The storage container of claim 2 wherein said compressible material is in the form of an O-ring.

4. The storage container of claim 2 wherein said compressible material is present as a layer on said at least one surface of said first and second container sections.

5. The storage container of claim 1 wherein said first and second container sections are formed from a material selected from the group consisting of metal, plastic, and combinations thereof.

6. A storage container for a lithography mask, which storage container is periodically used independently of a lithography system which is used in combination with said mask, said storage container comprising:

a first container section formed of a sturdy material which does not deform upon exposure to a vacuum adequate to provide air tight sealing of said storage container, and defining a first cavity which is shaped for contacting an edge section of a mask to be stored in said storage container, where said first container section covers, but does not contact an area of a mask pattern on said mask when said edge section of said mask is placed in contact with a surface on said first container section;

a second container section formed from a sturdy material and defining a second cavity therein having a size which contacts an edge section of a mask to be stored in said storage container, wherein a combination of said first and second container sections fixedly houses said mask between said first and second cavities and provides an air tight seal within said storage container when a pressure within said first and second cavities is less than a pressure outside said storage container, whereby dust and other particles cannot reach said mask stored in said cavity, and wherein said first and second container sections are essentially solely held together to form said cavity by the pressure difference between the pressure within said cavity and the pressure outside said storage container.

7. The storage container of claim 6, further comprising a compressible material capable of forming an air tight seal between said first container section and said second container section, wherein said compressible material is located on a surface of at least one of said first and second container sections which come together to provide said air tight seal.

8. The storage container of claim 7 wherein the compressible material is in the form of an O-ring.

9. The storage container of claim 6, wherein said compressible material is present as a layer on said at least one surface of said first and second container sections.

10. The storage container of claim 6, wherein said first and second container sections are formed from a material selected from the group consisting of metal, plastic, and combinations thereof.

11. A method of storing a lithographic mask in a storage container, the method comprising:

placing a cleaned first section of said storage container and a cleaned second section of said storage container and a cleaned lithographic mask in a chamber and reducing a pressure surrounding said first section and said second section of said storage container and said lithographic mask within said chamber to a first pressure level;

while said mask is in said chamber at said first pressure level, enclosing said mask in a storage container constructed from said first section of a storage container and said second section of a storage container in a manner such that a mask pattern on said mask does not contact any portion of said storage container; and while said mask is in said chamber, raising a pressure in said chamber to increase said pressure to a second pressure level, to create pressure on a compressible material present between mating surfaces of said first section of said storage container and said second section of said storage container to form an air tight seal which protects said mask from dust and particles and any pressure changes once said storage container is removed from said chamber.

12. The method of claim 11 wherein said compressible material which assists in providing said air tight seal is located on a surface of at least one of said first and second container sections.

13. The method of claim 12 wherein said compressible material is in the form of an O-ring.

14. The method of claim 12 wherein said compressible material is present as a layer on said at least one surface of said first and second container sections.

15. The method of claim 11 wherein said first and second container sections are formed from a material selected from the group consisting of metal, plastic, and combinations thereof.

16. The method of claim 11 wherein said first pressure level is below normal atmospheric pressure and said second pressure level is atmospheric pressure.

17. An assembly including a storage container for a lithography mask, which storage container is periodically used independently of a lithography system which is used in combination with said mask, wherein said storage container comprises:

a first container section formed of a sturdy material which does not deform upon exposure to a vacuum adequate to provide air tight sealing of said storage container; and a second container section formed of said sturdy material, wherein said first and second container sections used in combination define a cavity sized to fixedly house said mask, while not contacting a mask pattern on said mask, and wherein said first and second container sections used in combination provide an air tight seal around said cavity when a pressure within said cavity is less than a pressure outside said storage container, whereby dust and other particles cannot reach said mask housed in said cavity, and wherein said first and second container sections are essentially solely held together to form said cavity by the pressure difference between the pressure within said cavity and the pressure outside said storage container;

and wherein said assembly further comprises a clean mask present in said cavity formed from a combination of said first container section and said second container section under said air tight seal.

18. An assembly including a storage container for a lithography mask, which storage container is periodically used independently of a lithography system which is used in combination with said mask, wherein said storage container comprises:

a first container section formed of a sturdy material which does not deform upon exposure to a vacuum adequate to provide air tight sealing of said storage container, and defining a first cavity which is shaped for contacting an edge section of a mask to be stored in said storage container, where said first container section covers, but does not contact an area of a mask pattern on said mask when said edge section of said mask is placed in contact with a surface on said first container section;

a second container section formed from a sturdy material and defining a second cavity therein having a size which contacts an edge section of a mask to be stored in said storage container, wherein a combination of said first and second container sections fixedly houses said mask between said first and second cavities and provides an air tight seal within said storage container when a pressure within said first and second cavities is less than a pressure outside said storage container, whereby dust and other particles cannot reach said mask stored in said cavity, and wherein said first and second container sections are essentially solely held together to form said cavity by the pressure difference between the pressure within said cavity and the pressure outside said storage container;

and wherein said assembly further comprises a clean mask present in a cavity between said first container section and said second container section under an air tight seal.

* * * * *